United States Patent [19]
Bus-Kwoffie et al.

[11] Patent Number: 6,051,099
[45] Date of Patent: Apr. 18, 2000

[54] APPARATUS FOR ACHIEVING ETCH RATE UNIFORMITY

[75] Inventors: Raymond Bus-Kwoffie, Santa Clara; Son Van Nguyen, Los Gatos; Diana Perez, San Jose; Andrew Chiuyan Ting, San Jose; John Wesley Williams, San Jose, all of Calif.

[73] Assignee: International Business Machines Corporation, Armonk, N.Y.

[21] Appl. No.: 08/949,720

[22] Filed: Oct. 14, 1997

[51] Int. Cl.⁷ ..................................................... H05H 1/00
[52] U.S. Cl. ...................... 156/345; 118/723 E; 118/724
[58] Field of Search ............ 118/723 R, 723 FI, 118/723 E, 715, 723 ME, 733, 724; 156/345

[56] References Cited

U.S. PATENT DOCUMENTS

| | | |
|---|---|---|
| 4,981,722 | 1/1991 | Moeller et al. . |
| 5,099,100 | 3/1992 | Bersin et al. . |
| 5,213,658 | 5/1993 | Ishida . |
| 5,217,560 | 6/1993 | Kurono et al. . |
| 5,234,529 | 8/1993 | Johnson . |
| 5,246,532 | 9/1993 | Ishida . |
| 5,292,396 | 3/1994 | Takashima et al. . |
| 5,362,353 | 11/1994 | Mallon . |
| 5,364,488 | 11/1994 | Minato et al. . |
| 5,391,252 | 2/1995 | Taylor . |
| 5,534,751 | 7/1996 | Lenz et al. . |
| 5,552,124 | 9/1996 | Su . |

FOREIGN PATENT DOCUMENTS

313   5/1990   United Kingdom .

OTHER PUBLICATIONS

Means for Controlling Radio Frequency Sputtering Potentials, 1988, vol. 30 No. 8 pp. 335–336 (No Month).
New Frontiers in Plasma Etching, Jul. 1996, pp. 152–164.
High Rate and Smooth Surface Etching of $Al_2O_3$–TiC Employing Inductively Coupled Plasma (ICP), 1995, pp. 185–188 (No Month).

*Primary Examiner*—Timothy Meeks
*Assistant Examiner*—Parviz Hassanzadeh
*Attorney, Agent, or Firm*—Altera Law Group. LLC

[57] ABSTRACT

A can for use in an etching system including a continuous conductive wall with a first opening to be placed adjacent the reactor upper electrode and a second opening to be placed adjacent the reactor lower electrode. Preferably, the conductive wall is a dual wall further including an inner wall and an outer wall, the inner and outer wall separated by one or more openings configured normal to the height of the continuous wall, the openings allowing for the flow of coolant through the wall.

29 Claims, 4 Drawing Sheets

APPARATUS FOR ACHIEVING ETCH RATE UNIFORMITY

BACKGROUND OF THE INVENTION

1. Field of the Invention

This invention relates generally to an apparatus for enhancing etch rate uniformity, and more particularly to an apparatus for achieving etch rate uniformity in etching systems such as reactive ion etching, high density plasma systems, and ion beam etching systems.

2. Background of the Invention

In the data storage industry, the most widely used storage device is the magnetic hard disk drive (HDD). The HDD uses magnetic heads, which fly over the magnetic disk, to read and write the data from and to the magnetic disk. In order for the head to fly over the disk in a predictable and stable fashion, the head may be integrally formed or attached to a slider body with an air bearing surface (ABS) facing the disk. With a proper air bearing design, the slider can be flown very closely over the disk. Currently the flying height of the slider over the disk is in the range of 2–3 micro-inches (0.050–0.075 um). However, lowering the fly height is a never ending pursuit.

To achieve such a low flying height without crashing, it is critical that the fabricated ABS structure satisfies the tight tolerances of the design requirements. Several techniques have been used to produce such an ABS, including mechanical machining, ion milling, and reactive ion etching (RIE). For the more advanced ABS design such as Transvers Pressure Contour (TPC), there are steps on the ABS that are less than 1 micrometer deep. Consequently, the required tolerance is much tighter than mechanical machining can deliver. Ion milling has been the preferred process for fabricating this type of step. However, ion milling does not have the throughput capacity across the entire cathode to produce such a step with acceptable uniformity.

Reactive ion etching (RIE) does have the requisite throughout capacity; however, there are drawbacks associated with RIE. The etch rate in a reactive ion etcher is typically higher around the cathode perimeter due to an edge effect on the plasma distribution and typically higher at the center because of the gas distribution, i.e., the gas inlet valve is typically at the center of the chamber. Many attempts have been made to modify the etch rate distribution, including modification of process parameters, such as gas pressure, gas composition, input power, etc. Other attempts to modify the etch rate distribution have focused on modifying chamber geometry, such as reactor can design, gas flow pattern, and gas inlet shower head, among other variables.

For example, Su et al., U.S. Pat. No. 5,552,124 teaches use of an open gas focus ring structure in the plasma reactor to improve the gas distribution above the etch water area. This ring also is used to reduce contamination and the enhance gas flow uniformity. Lenz et al., U.S. Pat. No. 5,534,751 discloses stack of quartz, ($SiO_2$ or ceramic), rings used to deactivate charged particles of gas. Taylor, U.S. Pat. No. 5,391,252 discloses a plasma apparatus with an extended RF electrode portion near the etch piece surface. This extended RF head and assembly is also used to monitor and control pressure in the etch region.

Further, Minato et al., U.S. Pat. No. 5,364,488 discloses a cylindrically shaped 3-layer plasma apparatus which is utilized for vertical multi-wafer plasma etching of photoresists. The purpose of these "porous" multi-layers is to minimize ion bombardment and damage on the etch surface for silicon device application. Mallon, U.S. Pat. No. 5,362,353 discloses a Faraday cage configuration including a cylindrical metallic with a quartz reactor vessel to minimize ion bombardment and etch damage on etched pieces.

Ishida, U.S. Pat. Nos. 5,246,532 and 5,213,658 disclose apparatus and methods using a partial ring to reduce the magnet effect and gas flow to achieve more precise etching. This slightly elevated ring is used mainly for reducing magnetic field effects that cause poor plasma etch uniformity.

Although these approaches address many design concerns with etching systems, there still exists a need for increasing plasma density in the reactor to allow uniform operation in the etching environment.

SUMMARY OF THE INVENTION

In accordance with a first aspect of the invention, there is provided a can for use in an etching reactor, the can comprising a continuous wall with a first opening to be placed adjacent the reactor upper electrode and a second opening to be placed adjacent the reactor lower electrode.

In accordance with a further aspect of the invention, there is provided a reactor for etching comprising an upper electrode a lower electrode; and a can, the can attached to the reactor adjacent the upper electrode, the can comprising a continuous dual wall, the can having a first opening adjacent the upper electrode and a second opening adjacent the lower electrode, the dual wall further comprising an inner and outer wall separated by one or more openings, the openings allowing for the flow of coolant through the dual wall.

Other objects, features, and advantages of the invention will be apparent from the accompanying drawings and from the detailed description provided below.

BRIEF DESCRIPTION OF THE DRAWINGS

The present invention is illustrated by way of example and not limitation in the figures and drawings in which like features are designated with like numerals throughout several views.

DETAILED DESCRIPTION OF THE PREFERRED EMBODIMENTS

Figure 1:
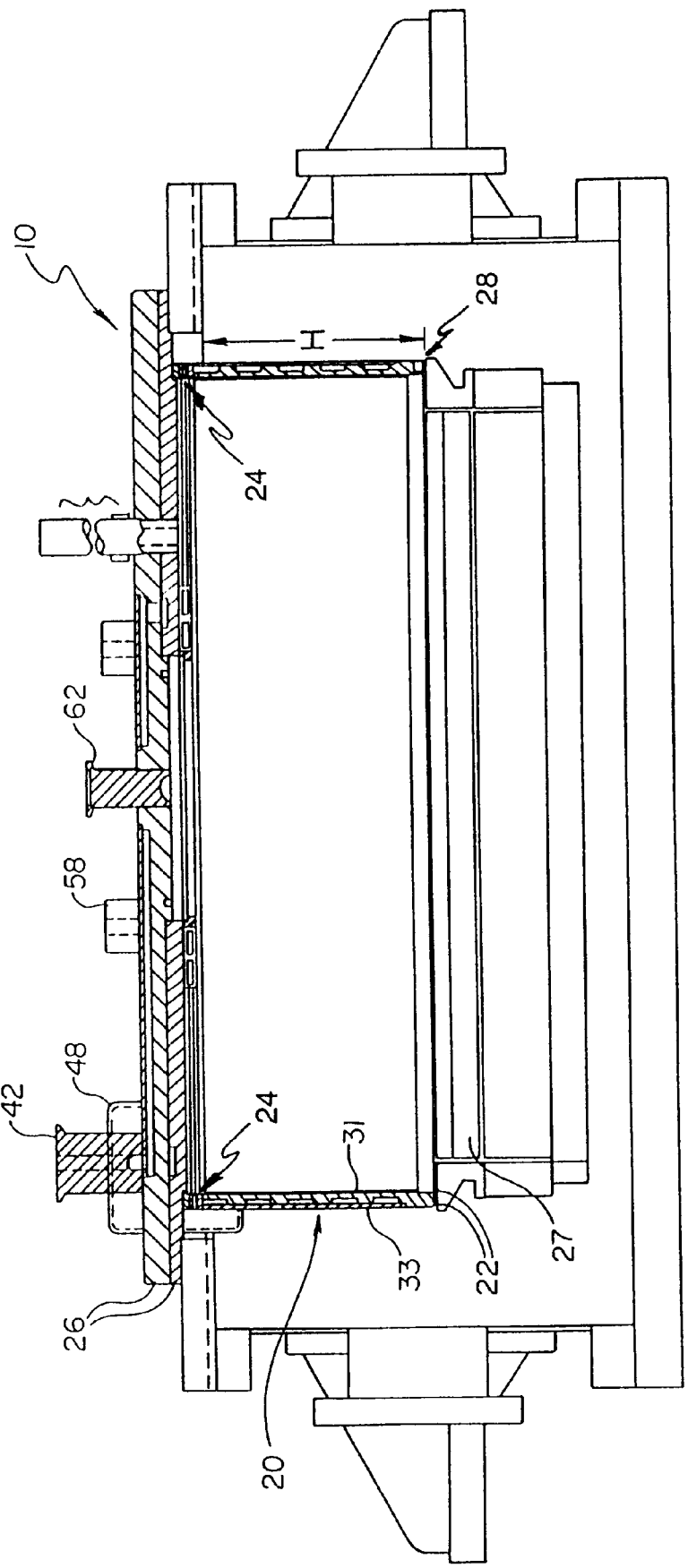
FIG. 1 is a side view of one embodiment of a reactor that includes a plasma density enhancing can of the invention.

The invention may be used with any etching system known to those of skill in the art. These etching systems include without limitation high density plasma systems, ion beam etching systems, and reactive ion etching systems. Reactive ion etching systems are generally typified by a reactor and an ion source. The reactive ion etching process generally takes place between an upper electrode and a lower electrode in a reactor. Our invention includes a reactor can which may be used to focus ion flow onto a substrate which is used to support the work piece to be etched. The system generally may also comprise temperature controls for the etching substrate, etch reactor can, as well as the ion source. The reactive ion etching system generally also has various gas sources to facilitate and promote the ion etching reaction.

In operation, the reactive ion etching system may be optimized to maintain a high etch rate. High etch rate is generally used to maintain high throughput and is generally increased at the cost of decreasing etch selectivity. Etch selectivity is generally regarded as the ratio of the etch rate of one material compared to that of another material. Selectivity may be controlled by using masking layers or photoresists of different thickness. Apart from the susceptibility of the mask to etching, the thickness of the mask may be used to increase selectivity for definition of smaller features. Mask layers, among other tools, may also be used to control etch profile, passivate etch side walls, and control redeposition of particles.

Etching systems and processes may be used to fabricate any number of devices including semiconductors and the components of hard disk drives such as sliders. For slider fabrication, a hard material such as $Al_2O_3/TiC$ is patterned by advanced reactive ion etching or ion beam etching to form the Air Bearing Surface (ABS) of a slider. Fabrication of high density DRAM capacitor storage devices may use inert gases and reactive fluorine-based and chlorine-based gases. Plasma RIE and Ion beam etch process remove non-volatile ferroelectric and metallic films.

For these hard materials, high energy ion bombardment is required to sputter-off the films. For example, in the etching of $Al_2O_3$ films by chemical enhanced physical sputtering in fluorocarbon gas RIE plasma, the threshold energy is about 20 eV in $SF_6$, 25–30 eV in $CHF_3$ and 50 eV in argon. These high threshold energies are substantially higher than normal RIE processes used in semiconductor integrated circuit fabrication.

As a result, high rf plasma power with substantial self-bias voltage is required during processing. At high rf power, high self-bias and low-pressure plasma, there is significantly higher ion bombardment energy, as well as increased plasma density and increased reactive species. These parameters make it more difficult to confine the desirable etch area.

In larger plasma RIE reactors, neutral plasma reactive species at higher plasma density will diffuse readily and deactivate. This effect may cause large areas of nonuniform etching. In the past, various magnetically confined methods had been used to reduce this plasma reactive species diffusion in 8 inch diameter equipment. However, this method is expensive and impractical for large (>20 inches diameter) plasma reactors. Furthermore, the redeposition of nonvolatile by-products during the etching of $Al_2O_3/TiC$ on to the reactor wall may also necessitate substantial cleaning of the equipment.

The reactor can may be used to confine the plasma to the etch area. The conductive metallic side wall of the invention emits electrons out into the plasma as ion bombardment occurs in the discharge. This compensates and minimizes the loss in plasma density. The invention also reduces the redeposition of the etch by-product to reactor wall, thus minimizing the cleaning requirement. The invention enhances plasma density and improves plasma uniformity.

FIG. 1, illustrates one embodiment of a reactor 10. Reactor 10 includes a reactor can 20, positioned between an upper electrode 26 and a lower electrode 27. The can 20 comprises a continuous wall 22 with a first opening 24 located adjacent to the reactor upper electrode 26, (see FIG. 2), and a second opening 28 located adjacent to the reactor lower electrode 27, (see FIG. 1).

Preferably, can 20 comprises a wall 22 which is a continuous structure without any openings extending from the inner surface 31 of the wall 22 to the outer surface 33 of the wall 20 FIG. 1. Alternatively, can 22 may include a single wall. The inner surface of the wall 22, preferably has an insulative coating such as alumina ($Al_2O_3$) or boron nitride to confine the plasma and minimize contamination. The can 20 may be circular, square, or rectangular in shape. The can wall 22 may be biased 35 through the use of direct current or radio frequency power attached to the can 20. For example, from 50 KHz to 200 MHz of radio frequency power 35 may be used to bias the can 20. The continuous wall 22 further comprises an inner wall 30 and an outer wall 32. The inner 30 and outer 32 walls are separated by one or more openings 34. The openings 34 allow for the flow of a coolant such as water through the dual wall 22 and generally run in a direction which is normal to the height (H) of the can wall 22, FIGS. 1 and 3.

Figure 3:
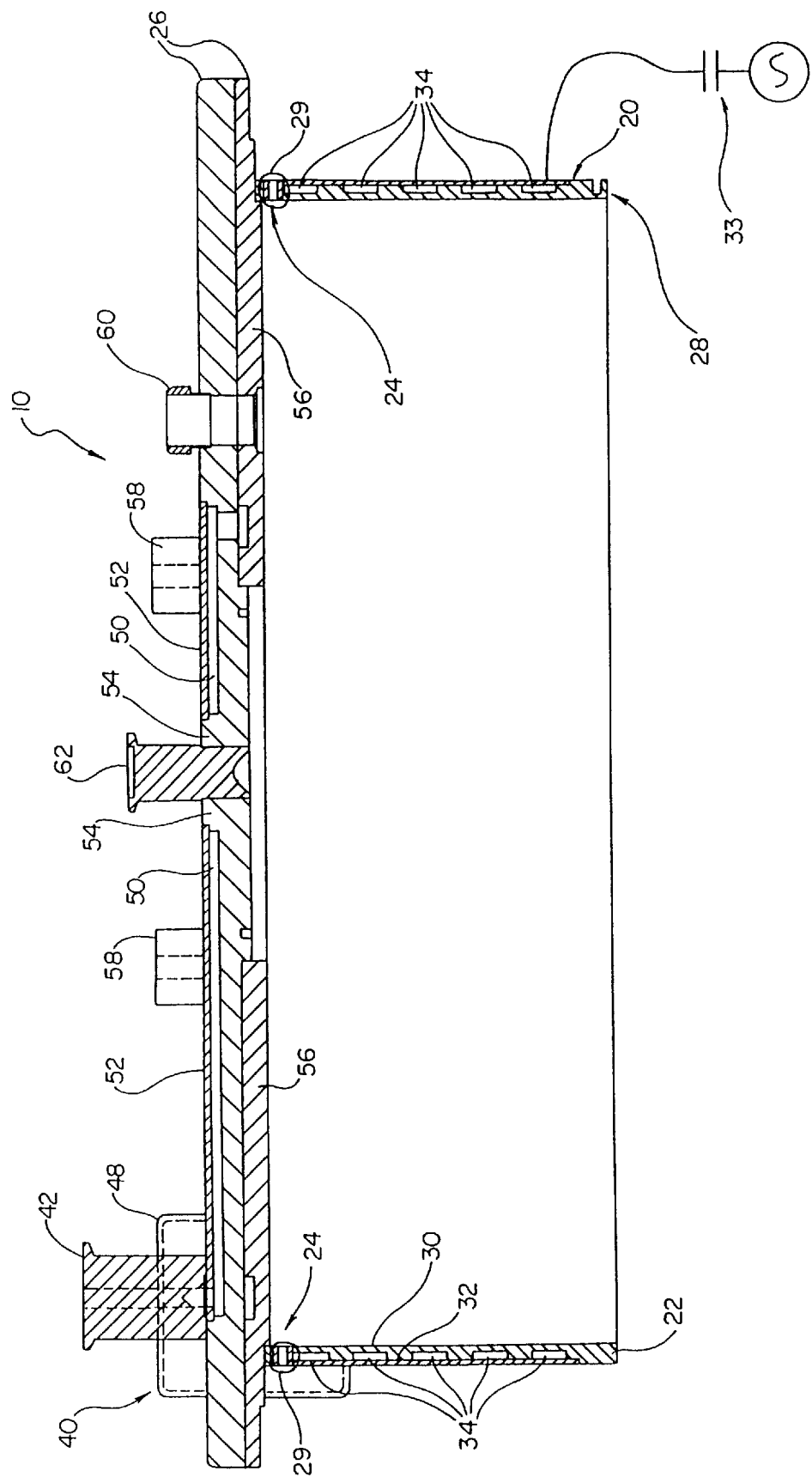
FIG. 3 depicts a sectional side view of the reactor can shown in FIG. 2 taken along line A—A.

FIG. 3 illustrates a portion of reactor 10 in more detail. A void 50 in the upper electrode 26 is formed between a cooling void cover 52 and the upper electrode top plate 54, FIG. 3. Further, openings 34 are formed between a two-part wall having an inner part 30 and a separate outer part 32. The openings 34 may be formed by the use of steps in either the inner part 30 or outer part 32 as shown in FIG. 3. Generally, the openings 34 are formed to run at a right angle or normal to the height (H) of the wall 22. The height of wall 22 is defined by the distance (H) between the upper electrode 26 and the lower electrode 27.

A bottom plate 56 of the upper electrode 26 supports and is configured to fit within the top plate 54 of the upper electrode 26. The upper electrode 26 may also comprise one or more standoffs 58 to assist in the physical manipulation of the upper electrode 26. A vacuum sealed port 60 may also be configured in upper electrode 26 so that work pieces may be viewed during processing. Preferably a gas feed 62, is also configured into the upper electrode 26 in order to facilitate the flow of gas and the reactive ion etching processes.

Generally, the upper electrode is biased according to reactive ion etching processes known to those of skill in the art. Preferably, the continuous wall 22 of the can 20 has an electrical conductivity of about 65 to 85 microohms-cm, generally about 72 microohms-cm depending upon the power applied. Power is generally applied at a level of about 100 to 1000 watts, preferably about 200 to 500 watts.

More preferably, the can 20 comprises a conductive metal or metal alloy such as any of the known grades of wrought stainless steel like 303, 304, or any of the other 300 series grades as described by the ASM Committee on wrought stainless steel, (Metal Handbook: Properties and Selection of Metals, Volume 1, 8th Edition). Additionally, useful metals include those materials comprising elements of Fe, Al, Ni, Cr, Si, C and mixtures thereof.

In order to facilitate the etching process, and ensure a continued bias between the upper electrode 26 and the lower electrode 27, the can 20 may be insulated from the upper electrode 26 around its circumference at the point 29 of contact between the can 20 and the upper electrode 26 by any suitable means. Frequently used insulators include polymeric plastics which can withstand reactor temperatures (100° C. or more) without melting. As can be seen in FIG. 1, the lower electrode 27 does not contact the can 20.

Figure 4:
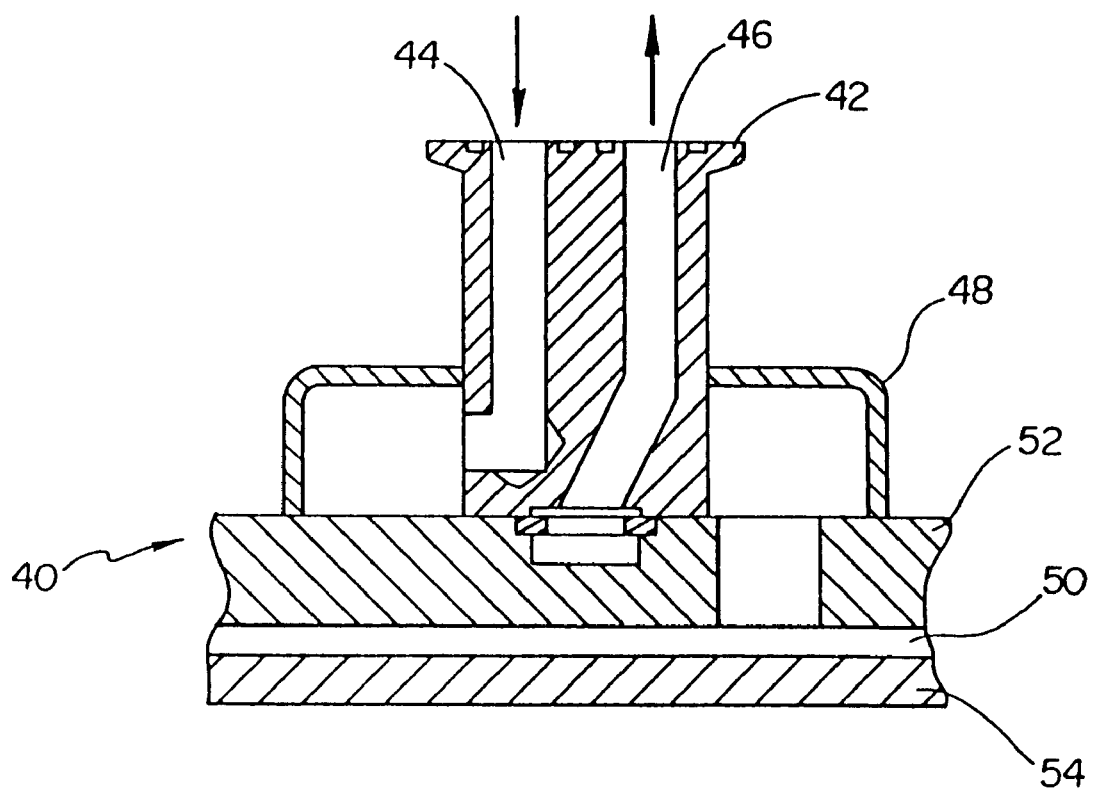
FIG. 4 depicts a cutaway view of the coolant inlet and outlet assembly of the reactor shown in FIG. 2 taken along lines B—B.

The coolant feed assembly 40 is shown in FIG. 4. The coolant feed assembly 40 includes a coolant feed tube 42 having an inlet 44 and an outlet 46 to allow the coolant to circulate across the top of the upper electrode 26 and through the openings 34 in the continuous wall 22 of the reactor can 20, FIG. 3. In one embodiment, the coolant enters through inlet 44 and fills the feed assembly housing 48. Once the housing 48 is filled, the coolant flows through to the voids 50 in the upper electrode 26, and to the openings 34 in the continuous wall 22. As one of skill in the art will realize having read this specification, any number of channels may be configured to allow coolant flow to the upper electrode 26 and continuous wall 22.

Figure 2:
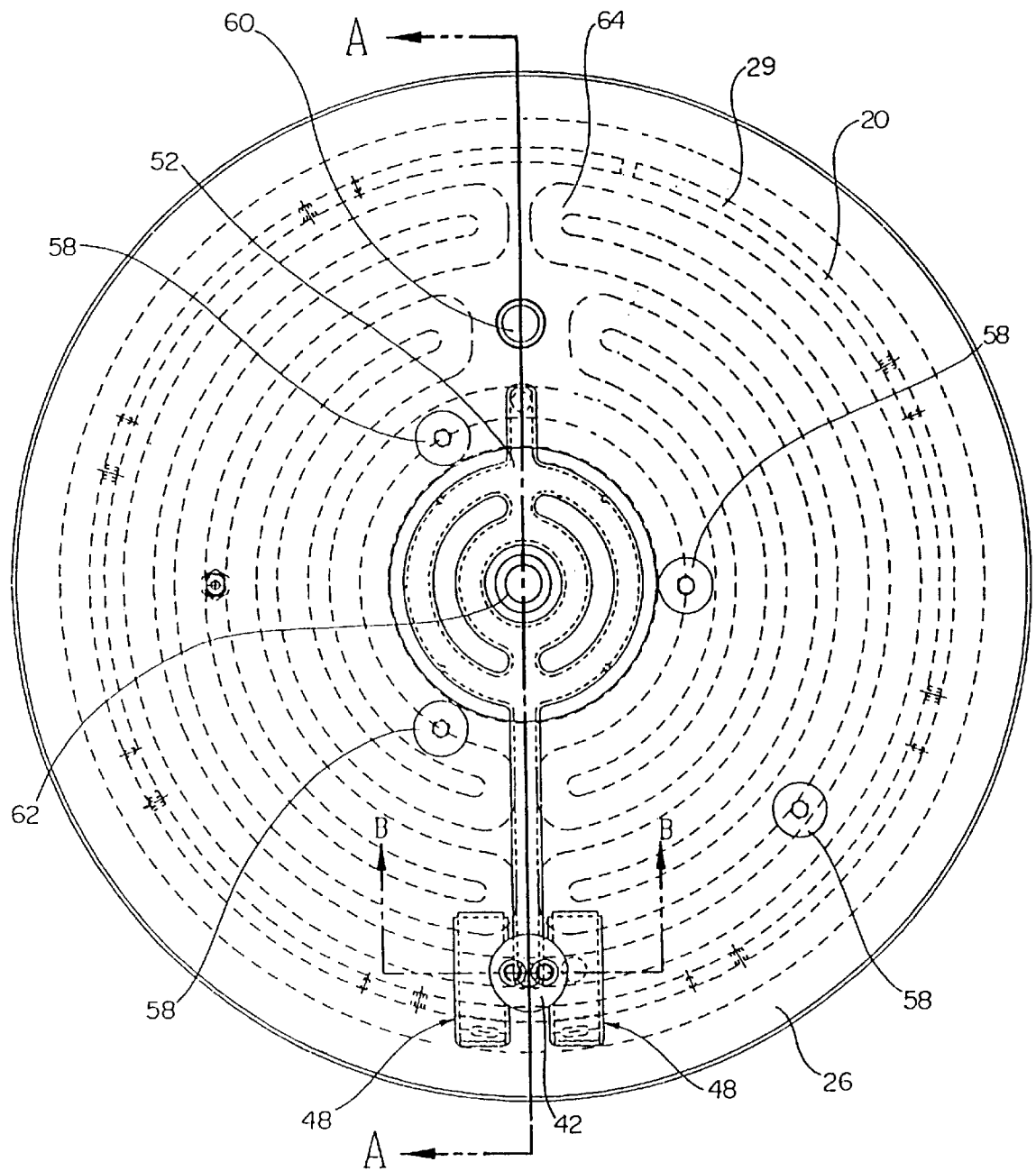
FIG. 2 depicts a top plan view of the reactor shown in FIG. 1.

As shown in FIG. 2, the can 20 may be circular, square, or rectangular in shape. The can is also preferably continuous in that it preferably has no openings which span from the inner plate 30 to the outer plate 32 of the wall. Electrode elements 64 may be patterned in the upper electrode 26 as well as the lower electrode 27 to facilitate charging the reactor and ion etching the work piece.

As configured, the invention may be used to reactive ion etch any number of workpieces such as $Ni_2O_3$, TiC, boron nitride, silicon carbide, any number of ceramics and $Al_2O_3$/TiC mixtures through reactive ion etch process such as those disclosed in U.S. Pat. Nos. 4,549,238; 5,308,463; and 4,030,967 all of which are incorporated herein by reference.

The foregoing description of the exemplary embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

We claim:

1. A can for use in an etching system, said can coupled to a reactor upper electrode, said can comprising a continuous conductive wall with a first opening to be placed adjacent said reactor upper electrode and a second opening to be placed adjacent a reactor lower electrode, wherein said wall further comprises an inner wall and an outer wall, said inner and outer walls separated by one or more openings configured normal to said continuous wall, said openings allowing for the flow of coolant through said dual wall.

2. The can of claim 1, wherein said dual wall comprises a material having a conductivity of about 72 microohms-cm.

3. The can of claim 2, wherein said material comprises a metal.

4. The can of claim 3, wherein said metal comprises stainless steel.

5. The can of claim 1, wherein said can is cylindrical in shape.

6. The can of claim 1, wherein said can is square in shape.

7. The can of claim 1, wherein said can is rectangular in shape.

8. The can of claim 1, wherein said inner wall and said outer wall are separated by at least five openings which are of substantially similar size, said openings being equally spaced apart over the height of the inner and outer wall.

9. The can of claim 1, wherein said continuous wall comprises an inner surface, said inner surface further comprises a coating of insulative material.

10. The can of claim 9, wherein said insulative material is selected from the group consisting of alumina and boron nitride.

11. The can of claim 1, wherein said etching system comprises a reactive ion etching system.

12. The can of claim 1, wherein said etching system comprises a high density plasma system.

13. The can of claim 1, wherein said etching system comprises an ion beam etching system.

14. A reactor for use in an etching system comprising:

(a) an upper electrode;

(b) a lower electrode; and (c) a can, said can coupled to said upper electrode, said can comprising a continuous dual wall, said can having a first opening adjacent said upper electrode and a second opening adjacent said lower electrode, said dual wall further comprising an inner and outer wall separated by one or more openings, said openings allowing for the flow of coolant through said dual wall.

15. The reactor of claim 14, wherein said can is electrically insulated from said upper electrode.

16. The reactor of claim 14, wherein said can and said lower electrode are not in contact.

17. The can of claim 14, wherein said can dual wall comprises a material having a conductivity of at least about 72 microohms-cm.

18. The reactor of claim 14, wherein said material comprises a metal.

19. The reactor of claim 14, wherein said metal comprises stainless steel.

20. The reactor of claim 14, wherein said can is cylindrical in shape.

21. The reactor of claim 14, wherein said can is square in shape.

22. The reactor of claim 14, wherein said can is rectangular in shape.

23. The reactor of claim 14, wherein said continuous dual wall does not include any openings which span from said inner wall through said outer walls.

24. The reactor of claim 14, wherein said can inner wall and said outer wall are separated by at least five openings which are of substantially similar size, said openings being equally spaced apart over the height of the inner and outer wall.

25. The reactor of claim 14, wherein said continuous wall comprises an inner surface, said inner surface further comprises an insulative material.

26. The reactor of claim 25, wherein said insulative material is selected from the group consisting of alumina and boron nitride.

27. The reactor of claim 14, wherein said etching system comprises a reactive ion etching system.

28. The reactor of claim 14, wherein said etching system comprises a high density plasma system.

29. The reactor of claim 14, wherein said etching system comprises an ion beam etching system.

* * * * *

UNITED STATES PATENT AND TRADEMARK OFFICE
CERTIFICATE OF CORRECTION

PATENT NO. : 6,051,099
DATED : April 18, 2000
INVENTOR(S) : Bus-Kwofie et al.

It is certified that error appears in the above-identified patent and that said Letters Patent is hereby corrected as shown below:

Title page,
Item [75], Inventors replace "Bus-Kwoffie" with -- Bus-Kwofie --;
Item [56], References Cited, U.S. PATENT DOCUMENTS, add the following:
--  5,554,255,   9/1996,   Karner et al. --
--  5,789,867,   8/1998,   Westendorp et al. --
--  5,082,517,   1/1992,   Moslehi --;
FOREIGN PATENT DOCUMENTS, add -- 2048470,  2/1999,  Canada --;

Column 2,
Line 22, replace "a" after "electrode" with -- and --;

Column 3,
Line 66, replace "20" with -- 22 --, and replace "22" with -- 20 --;

Column 4,
Line 7, add -- alternatively -- after "20";
Line 45, remove bold print from "303, 304".

Signed and Sealed this

Twenty-fourth Day of September, 2002

Attest:

Attesting Officer

JAMES E. ROGAN
*Director of the United States Patent and Trademark Office*